(12) United States Patent
Carpenter et al.

(10) Patent No.: US 11,810,702 B2
(45) Date of Patent: Nov. 7, 2023

(54) MULTILAYER SPACER BETWEEN MAGNETIC LAYERS FOR MAGNETIC DEVICE

(71) Applicant: IMEC vzw, Leuven (BE)

(72) Inventors: Robert Carpenter, Kessel-Lo (BE); Johan Swerts, Kessel-Lo (BE)

(73) Assignee: IMEC vzw, Leuven (BE)

(*) Notice: Subject to any disclaimer, the term of this patent is extended or adjusted under 35 U.S.C. 154(b) by 313 days.

(21) Appl. No.: 17/115,578

(22) Filed: Dec. 8, 2020

(65) Prior Publication Data

US 2021/0183557 A1 Jun. 17, 2021

(30) Foreign Application Priority Data

Dec. 12, 2019 (EP) .................................. 19215537

(51) Int. Cl.
| | |
|---|---|
| *H01F 10/32* | (2006.01) |
| *G11C 11/16* | (2006.01) |
| *H10B 61/00* | (2023.01) |
| *H10N 50/01* | (2023.01) |

(Continued)

(52) U.S. Cl.
CPC ........ *H01F 10/3254* (2013.01); *G11C 11/161* (2013.01); *H01F 10/3272* (2013.01);
(Continued)

(58) Field of Classification Search
CPC ............ H01F 10/3254; H01F 10/3268; H01F 10/3272; G11C 11/14–1697;
(Continued)

(56) References Cited

U.S. PATENT DOCUMENTS

| | | |
|---|---|---|
| 9,773,972 B1 | 9/2017 | Kim et al. |
| 9,876,163 B2 | 1/2018 | Tahmasebi et al. |

(Continued)

FOREIGN PATENT DOCUMENTS

EP   3 460 811 A1   3/2019

OTHER PUBLICATIONS

Yun, S., Lim, S., Lee, S. Strong interlayer exchange coupling and high post-annealing stability in perpendicularly magnetized [Pt/Co]/Ru/[Co/Pt] structures AIP Advances 6, 025112 (2016) (Year: 2016).*

Extended European Search Report dated Jun. 16, 2020 in counterpart European Application No. 19215537.2 in 8 pages.

*Primary Examiner* — Evren Seven
*Assistant Examiner* — Cole Leon Lindsey
(74) *Attorney, Agent, or Firm* — Knobbe Martens Olson & Bear LLP

(57) ABSTRACT

The disclosed technology relates generally to the field of magnetic devices, in particular to magnetic memory devices or logic devices. The disclosed technology presents a magnetic structure for a magnetic device, wherein the magnetic structure comprises a magnetic reference layer (RL); a spacer provided on the magnetic RL, the spacer comprising a first texture breaking layer provided on the magnetic RL, a magnetic bridge layer provided on the first texture breaking layer, and a second texture breaking layer provided on the magnetic bridge layer. Further, the magnetic structure comprising a magnetic pinned layer (PL) or hard layer (HL) provided on the spacer, wherein the magnetic RL and the magnetic PL or HL are magnetically coupled across the spacer through direct exchange interaction.

20 Claims, 8 Drawing Sheets

(51) Int. Cl.
*H10N 50/10* (2023.01)
*H10N 50/80* (2023.01)
*H10N 50/85* (2023.01)

(52) U.S. Cl.
CPC ............ *H10B 61/00* (2023.02); *H10N 50/01* (2023.02); *H10N 50/10* (2023.02); *H10N 50/80* (2023.02); *H10N 50/85* (2023.02)

(58) Field of Classification Search
CPC ......... G11C 11/5607; G11C 1114/0036; G11C 1114/0045; G11C 1114/0081; H01L 27/222–228; H01L 43/02; H01L 43/08; H01L 43/10; H01L 43/12
See application file for complete search history.

(56) References Cited

U.S. PATENT DOCUMENTS

| | | |
|---|---|---|
| 10,283,246 B1 | 5/2019 | Shum et al. |
| 2014/0048894 A1* | 2/2014 | Li .................. G11C 11/1693 |
| | | 257/421 |
| 2016/0260892 A1 | 9/2016 | Tahmasebi et al. |
| 2016/0276407 A1 | 9/2016 | Naik et al. |
| 2017/0125664 A1* | 5/2017 | Tahmasebi ............. H10N 50/10 |
| 2019/0051822 A1 | 2/2019 | Chatterjee et al. |
| 2019/0088713 A1* | 3/2019 | Swerts ................... H01L 43/08 |
| 2019/0221734 A1* | 7/2019 | Oguz .................... H10N 50/01 |
| 2021/0384415 A1* | 12/2021 | Sun ......................... H01L 43/12 |

* cited by examiner

MULTILAYER SPACER BETWEEN MAGNETIC LAYERS FOR MAGNETIC DEVICE

CROSS-REFERENCE TO RELATED APPLICATIONS

This application claims foreign priority to European Patent Application No. EP 19215537.2, filed Dec. 12, 2019, the content of which is incorporated by reference herein in its entirety.

BACKGROUND

Field

The disclosed technology generally relates generally to semiconductor devices, and more particularly to magnetic memory devices or logic devices.

Description of the Related Technology

In various magnetic devices, for example, in a conventional magnetic random access memory (MRAM) device, information is stored in a magnetic structure called the magnetic free layer (FL). For data read/write, a fixed magnetic reference layer (RL) is used. For example, the RL layer is made of a CoFeB material, in order to optimize a switching current and a tunneling magnetoresistance ratio (TMR) of the memory device.

SUMMARY OF CERTAIN INVENTIVE ASPECTS

Embodiments of the present disclosure aim to provide an improved spacer between a magnetic reference layer (RL) and a magnetic pinned layer (PL) or hard layer (HL). An objective is, in particular, to provide a magnetic structure, in which the RL and PL or HL are better coupled to another, and are more robust to BEOL processing. Further, a height of the magnetic structure should be minimized, in particular, the height should be less than that of a magnetic structure in a conventional magnetic devices. The magnetic structure should be suitable for a top-pinned magnetic device, e.g. MRAM device, with a high PF of the RL. Finally, high density applications and downscaling should be enabled by the magnetic structure.

The objective is achieved by the embodiments provided in the claims. Embodiments with particular utility are defined in the dependent claims.

The embodiments disclosed herein can be specifically suitable for spintronic devices, which use a top-pinned MTJ stack as a component. Examples of such devices are spin-orbit torque (SOT)-MRAM devices, voltage-controlled magnetic anisotropy (VCMA)-MRAM devices, spin-torque-transfer (STT)-MRAM devices containing a top-pinned RL, and spin logic devices such as spin torque majority gate (STMG) devices. These kinds of devices are considered next/future generation, and a significant step in their development is demonstration of BEOL process tolerance.

A first aspect of the disclosure provides a magnetic structure for a magnetic device, the magnetic structure comprising: a magnetic RL; a spacer provided on the magnetic RL, the spacer comprising a first texture breaking layer provided on the magnetic RL, a magnetic bridge layer provided on the first texture breaking layer, and a second texture breaking layer provided on the magnetic bridge layer; the magnetic structure further comprising: a magnetic PL or HL provided on the spacer, wherein the magnetic RL and the magnetic PL or HL are magnetically coupled across the spacer through direct exchange interaction.

The spacer, also referred to as magnetic tri-layer spacer (MTLS), provides strong magnetic coupling between the RL and the PL or HL, while it also sufficiently breaks the texture between these layers (e.g. (001) to (111)) for an improved performance. The spacer is thin, and thus allows reducing the height of the magnetic structure. The magnetic structure of the first aspect is specifically designed for a top-pinned magnetic device, e.g., a top-pinned MRAM device, and achieves a high PF of the RL.

In this document, a layer being "provided on" another layer may mean that the layer is arranged "below" or "above" the other layer. Thereby, the terms "below"/"above" or "bottom"/"top" relate to layers of the magnetic structures and stacks, in particular to the fabrication/growth direction of the layers. In any case, "provided on" means that the layer is in contact with the other layer. For instance, the layer may be (epitaxially) grown on the other layer.

In particular, the first texture breaking layer disrupts the RL texture, and acts as boron sink. The magnetic bridge layer bridges the coupling via direct exchange interaction, and also disrupts the RL texture. The second texture breaking layer provides a complete decoupling of the texture of the RL and the PL or HL, i.e. provides a final texture break, and enables to provide additional magnetic material on top without Perpendicular Magnetic Anisotropy (PMA) loss.

In an implementation of the magnetic structure, the second texture breaking layer is a monolayer or sub-monolayer.

Thus, the magnetic coupling between the RL and PL or HL can be established by strong direct exchange interaction. However, in the case of the second texture breaking layer comprising, for example, W and/or Ta, it can be slightly thicker than a monolayer.

In an implementation of the magnetic structure, the second texture breaking layer comprises a material suitable for providing RKKY interaction, and a thickness of the material is less than a material thickness that corresponds to the first antiferromagnetic peak.

In an implementation of the magnetic structure, the second texture breaking layer comprises Ru, Ir, or Cr.

In an implementation of the magnetic structure, a thickness of the second texture breaking layer is less than 0.4 nm.

Thus, the second texture breaking layer has a thickness less than its first AF peak. Thus, direct magnetic coupling is achieved between RL and PL or HL.

In an implementation of the magnetic structure, the second texture breaking layer comprises Ta, Mo, or W.

In an implementation of the magnetic structure, a thickness of the second texture breaking layer is less than 0.6 nm.

Since these materials are not suitable for RKKY interaction, the maximum thickness can be 0.6 nm, that is, higher as for RKKY materials.

In an implementation of the magnetic structure, the magnetic bridge layer comprises Co, Ni, Fe, or an alloy thereof.

In an implementation of the magnetic structure, a thickness of the magnetic bridge layer is between 0.5-1.5 nm.

Accordingly, a good magnetic bridging and coupling is achieved.

In an implementation of the magnetic structure, the first texture breaking layer comprises Ta, W, Mo, or an alloy thereof.

In an implementation of the magnetic structure, a thickness of the first texture breaking layer is between 0.25-0.5 nm.

In an implementation of the magnetic structure, the magnetic HL comprises a 111-textured layer, in particular comprises one of the following alloys: Co(Fe)/Pt, Co(Fe)/Ni, Co(Fe)/Pd, Co(Fe)Pt, Co(Fe)Pd, or Co(Fe)Ni.

In an implementation, the magnetic structure further comprises: a tunnel barrier layer, on which the magnetic RL is provided, and a magnetic FL, on which the tunnel barrier is provided.

A second aspect of the disclosure provides a magnetic device comprising: a bottom electrode and a top electrode; and a magnetic structure according to the first aspect or any implementation thereof, wherein the magnetic structure is arranged between the bottom electrode and the top electrode.

In an implementation, the magnetic device is a top-pinned device and comprises one of: a synthetic ferromagnet (SFM) comprising the magnetic structure; a synthetic antiferromagnet (SAF) comprising the magnetic structure; a double SFM/SFM type MTJ comprising the magnetic structure; a double SAF/SAF type MTJ comprising the magnetic structure; a double SAF/SFM or SFM/SAF type MTJ comprising the magnetic structure.

A third aspect of the disclosure provides a method for fabricating a magnetic structure for a magnetic device, the method comprising: providing a magnetic RL; providing a spacer on the magnetic RL, the spacer comprising a first texture breaking layer provided on the magnetic RL, a magnetic bridge layer provided on the first texture breaking layer, and a second texture breaking layer provided on the magnetic bridge layer; the method further comprising: providing a magnetic PL or HL on the spacer, wherein the magnetic RL and the magnetic PL or HL are magnetically coupled across the spacer through direct exchange interaction.

In an implementation, the method further comprises: processing the magnetic structure, after providing the magnetic RL, the spacer, and the magnetic HL or PL, at a temperature of 350° C. or above.

In particular, the magnetic structure, fabricated by the method of the third aspect, is compatible with a 400° C. thermal budget, e.g., post MTJ patterning. It can withstand temperatures above 400° C. even for a longer time period. The same is true for the magnetic structure of the first aspect, which can also withstand temperatures above 350°, in particular above 400° C., for an extended period of time. The magnetic structures are thus suitable for BEOL processing with thermal budgets well above 400° C.

The method of the second aspect further achieves the same advantages as the magnetic structure of the first aspect and may be extended by respective implementations as described above for the device of the first aspect.

BRIEF DESCRIPTION OF THE DRAWINGS

The above described aspects and implementations are explained in the following description of embodiments with respect to the enclosed drawings, wherein.

DETAILED DESCRIPTION OF CERTAIN ILLUSTRATIVE EMBODIMENTS

To address the above-discussed and other needs, disclosed herein is a magnetic structure for a magnetic device, which can be a magnetic memory device or a logic device, such as a magnetic random access memory (MRAM) device. The magnetic structure for the magnetic device comprises a magnetic tri-layer spacer arranged between a magnetic hard layer (HL) or magnetic pinned layer (PL), and a magnetic reference layer (RL). Further disclosed herein is the magnetic device including the magnetic structure, and a method for fabricating the magnetic structure and/or the magnetic device.

The RL figures of merit include the uniaxial anisotropy, which should be large enough to ensure stability, and the pinning field (PF), which should be sufficient to ensure that the RL has a fixed orientation, regardless of the orientation of the FL.

In recognition of an issue in some MRAM devices, namely a conflict between the desired crystal orientations, or textures, for the magnetic PL or HL on the one hand, and on the other hand the magnetic tunnel junction (MTJ) stack including the RL (magnetically coupled to the PL or HL), a tunnel barrier, and the FL. For high performance MTJ stacks, the materials used have crystallized BCC structure with the (100) axis in-plane. Further, for a high-anisotropy HL, the materials used have an FCC structure and have the (111) axis in-plane. For an optimal performance, a full crystallization of these layers in these orientations is desirable, without the different textures disrupting each other. At the same time a strong magnetic coupling should be provided between the RL and the PL or HL.

Figure 6:
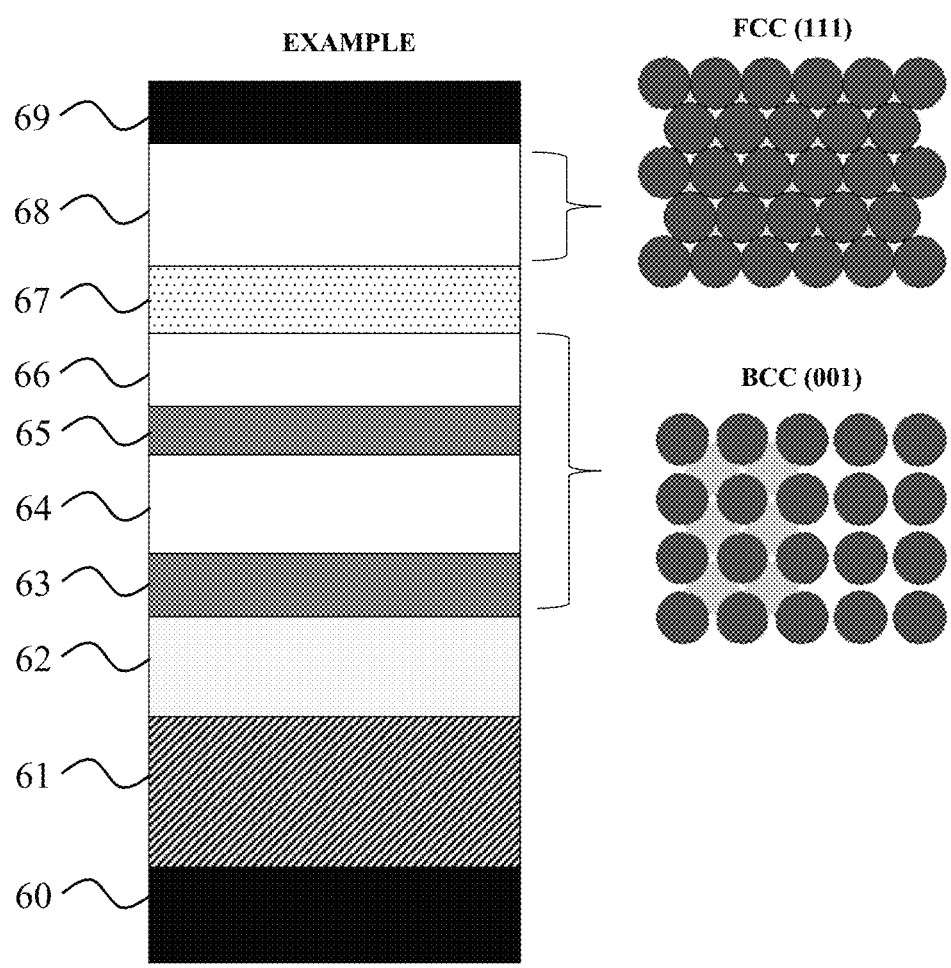
FIG. 6 shows an example of a magnetic stack.

FIG. 6 illustrates the above conflict with respect to a magnetic stack of an exemplary MRAM device, which includes the following layers provided on top of each other in the given order: a bottom seed layer 60, a compensation magnet (CM) 61, a decoupling layer 62, an MgO seed layer 63, a FL 64, an MgO tunnel barrier 65, a RL 66, a spacer 67, a HL 68, and a top cap layer 69. As indicated, the HL 68 in this example has a FCC (111) structure, while the MTJ stack—including the FL 64, the tunnel barrier 65 and the RL 66—has a BCC (001) structure. The spacer 67 is, in particular, provided between the RL and the HL as a texture breaking layer.

In the illustrated MRAM device, the desired magnetic and electric properties of the RL and HL depend on their crystal structure and orientation. However, these layers should also be strongly magnetically coupled. Thus, the spacer 67 should on the one hand disrupt the texture of the RL 66 and seed the texture of the HL 68, and should on the other hand be thin for sufficient magnetic coupling.

One of the key issues in the design of MRAM devices, particularly a top-pinned MRAM device, is a lack of robustness of the magnetic stack performance against backend-of-line (BEOL) processing conditions, as compared to bottom-pinned MRAM devices. A significant cause of this lack of robustness is the above-described mismatch in the crystal structures and textures of the PL or HL and the MTJ stack layers, in particular the RL. This is due to the fact that, in the case of a bottom-pinned MRAM device, the HL texture can be established via a seed layer. However, in a top-pinned MRAM device this is not possible, as the HL is deposited above the MTJ stack, which leads to a weaker HL and thus excessive diffusion of Pt and Fe.

HL cap engineering (e.g. a Cr cap) can enhance the HL BEOL robustness. However, to enable a full pinning layer robustness, particularly also a robustness of the RL and the HL, cap engineering may not be enough and different examples for spacers addressing this issue have been proposed.

Figure 7A:
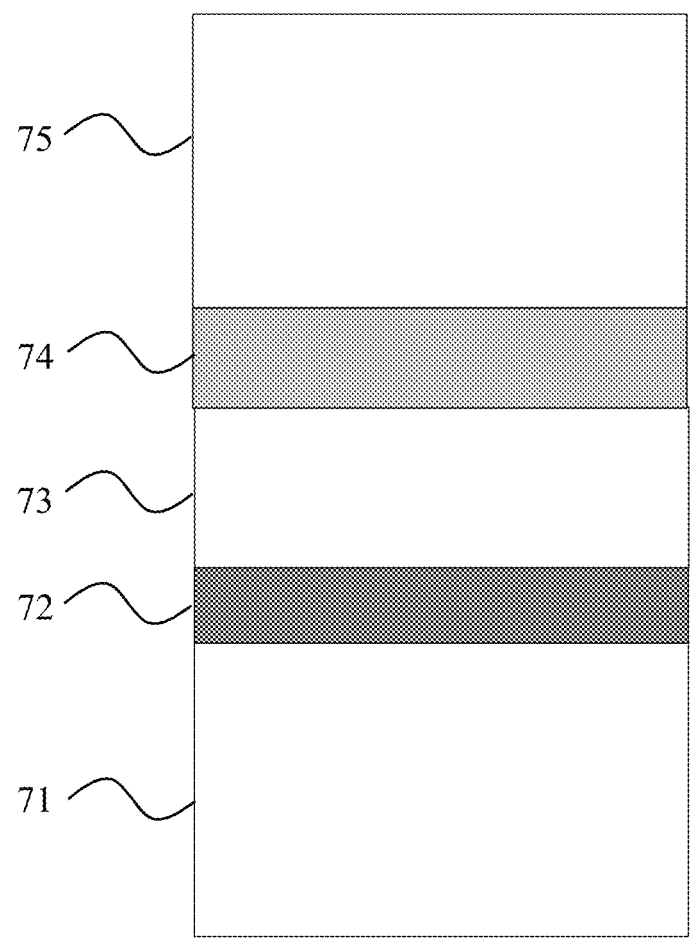
FIGS. 7A and 7B show examples of magnetic structures for a magnetic device.

FIG. 7A shows a first example, which includes the following layers provided on top of each other in the given order: a (001) RL 71, an amorphous spacer 72, a (111) PL 73, a Ruderman-Kittel-Kasuya-Yosida (RKKY) spacer layer 74, and a (111) HL 75. The illustrated layers may be formed over a tunnel barrier layer and/or a FL. The inventors have recognized that, while the amorphous spacer 72 can provide some texture breaking and magnetic coupling between the RL 71 and the PL 73, the above-described issues may not be overcome.

Figure 7B:
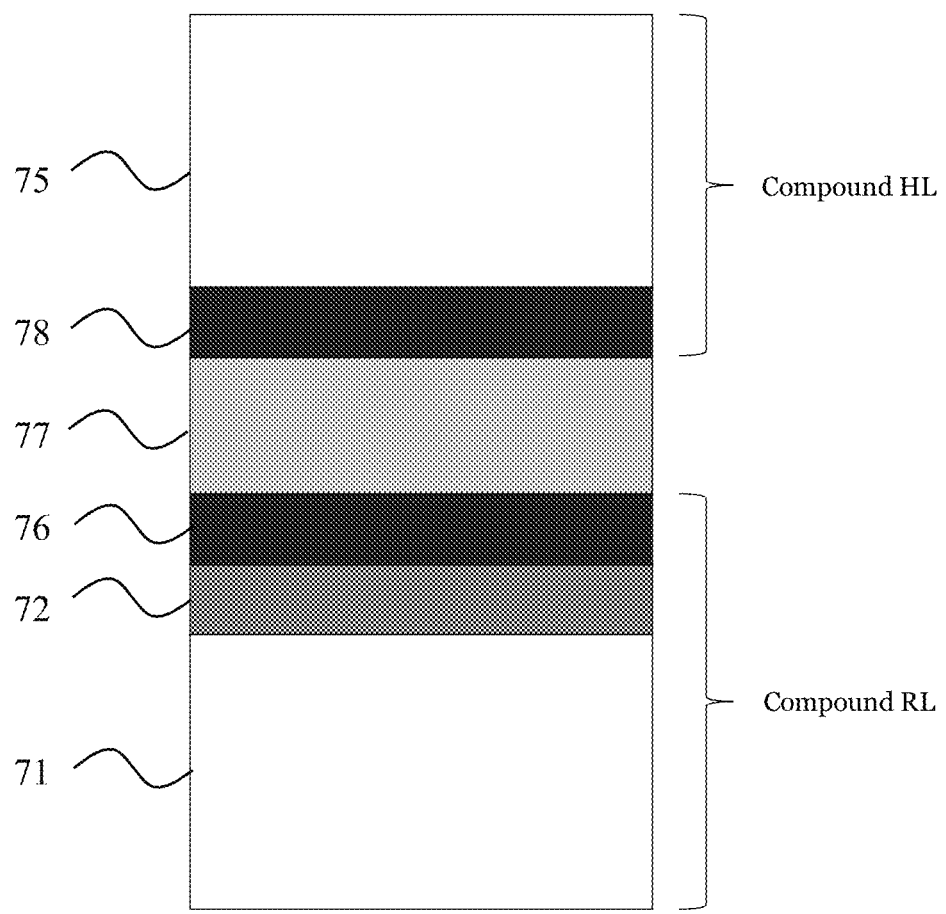

FIG. 7B shows a second example, which includes the following layers provided on top of each other in the given order: a (001) RL 71, an amorphous spacer 72, a first Co layer 76 (wherein the layers 71, 72 and 76 form a compound RL), a relatively thick RKKY spacer 77 (also called texture-inducing parallel coupling buffer (TIPCB)), a second Co layer 78, and a (111) HL 75 (wherein the layers 77 and 75 form a compound HL). The illustrated layers may be formed over a tunnel barrier layer and/or a FL.

In particular, the second example of FIG. 7B uses the TIPCB 77, in order to both induce a (111) texture in the HL 75, and to serve as a diffusion barrier. This can enable better BEOL compatibility in top-pinned MRAM devices, thus enabling standalone devices and suitable magnetic structures, for example, for initial double-MTJ stack designs.

However, the inventors have recognized that several issues may still remain in the second example. Firstly, the RKKY spacer 77, which couples the RL 71 to the HL 75 provides insufficient coupling for reliable devices. The PF obtained may be too low and a PF increase in the RL 71 may undesirably be obtained at cost of TMR. Secondly, the total thickness of the magnetic structure may be large and limit room for downscaling, due to a substantial contribution of the RKKY spacer 77 (which may be, e.g., ~3 nm). However, for high density applications, which target a pitch of 50 nm or less, height scaling may also be key to enabling a patterning process.

Finally, the second example illustrated in FIG. 7B may enable only a BEOL robust pinning layer design, where the RL 71 is ferromagnetically pinned to the HL 75. However, for some key applications, such as a spin-orbit-transfer (SOT)-MRAM device, it may be desirable to have a synthetic anti-ferromagnetic (SAF) pinning layer design. Such has not yet been demonstrated. Various embodiments disclosed herein address these and other shortcomings of existing designs of MRAM devices recognized by the inventors.

Figure 1:
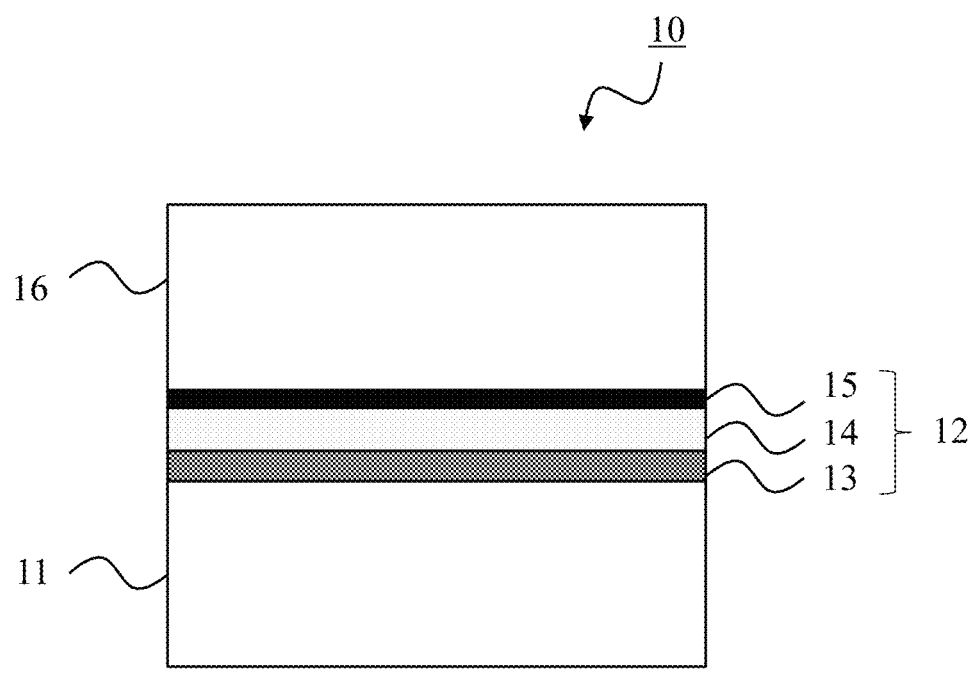
FIG. 1 shows a magnetic structure according to an embodiment of the disclosure.

FIG. 1 shows a magnetic structure 10 according to an embodiment of the disclosure. The magnetic structure 10 is suitable for a magnetic device 20, for instance, for an MRAM device such as an MRAM-based logic or memory device.

The magnetic structure 10 generally comprises a magnetic RL 11, a spacer 12 provided on the magnetic RL 11, and a magnetic PL or HL 16 provided on the spacer 12. The illustrated layers may be formed over a tunnel barrier. The RL 11, on the one hand, and the PL or HL 16, on the other hand, have a different structure/texture, in particular they have (001) and (111), respectively.

For example, the magnetic HL 16 may comprise a 111-textured layer. For instance, it may comprise at least one of the following alloys: Co(Fe)/Pt, Co(Fe)/Ni, Co(Fe)/Pd, Co(Fe)Pt, Co(Fe)Pd, or Co(Fe)Ni.

The spacer 12 (MTLS) comprises a first texture breaking layer 13 provided on the magnetic RL 11, a magnetic bridge layer 14 provided on the first texture breaking layer 13, and a second texture breaking layer 15 provided on the magnetic bridge layer 14. The spacer 12 is designed such that the magnetic RL 11 and the magnetic HL or PL 16 are magnetically coupled, across the spacer 12, through a direct exchange interaction. The direct magnetic coupling may not involve a RKKY interaction.

The first texture breaking layer 13 may be an amorphous layer, in particular it may be a Ta, W, or Mo layer. An alloy layer of any two or three of these exemplary materials is also possible. A thickness of the first texture breaking layer 13 may be, e.g., 0.25-0.5 nm. Without limitation, the first texture breaking layer 13 may serve to disrupt the texture of the RL 11, and to serve as boron sink.

The magnetic bridge layer 14 may be a magnetic metal or alloy, in particular it may be a Co, Ni, or Fe layer. An alloy layer of any two or three of these materials is also possible. A thickness of the magnetic bridge layer 14 may be, e.g., 0.5-1.5 nm. Without limitation, the magnetic bridge layer 14 may serve to bridge the coupling via direct exchange interaction. The direct exchange interaction may not involve a RKKY interaction. Moreover, the magnetic bridge layer 14 may further disrupts the RL texture.

The second texture breaking layer 15 may be an ultra-thin (e.g., <0.25 nm) layer, e.g., it may be a dusting layer. Generally, the second texture breaking layer 15 may comprises a layer of a material that is suitable for providing RKKY interaction, and a thickness of the layer/material may in this case be less than a material thickness that corresponds to the first antiferromagnetic peak (AP). For instance, the second texture breaking layer 15 may comprise a Ru, Ir, or Cr layer. In this case, a thickness of the second texture breaking layer 15 may be, e.g., less than 0.4 nm, or even less than 0.25 nm. The second texture breaking layer 15 may, however, also comprise a Ta, Mo or W layer. In this case, a thickness of the second texture breaking layer 15 may be, e.g., less than 0.6 nm, i.e., it can be slightly thicker as in the RKKY material case. The second texture breaking layer 15 may even be a monolayer or sub-monolayer. The second texture breaking layer 15 may serve to completely decouple the textures (or RL 11 and PL or HL 16). For example, it may provide a final texture break. Further, it enables providing one or more additional magnetic materials on top without PMA loss.

The spacer 12, in summary, enables direct exchange coupling of a BCC (100) RL 11 to a FCC (111) HL or PL 16. Further, the magnetic structure 10, including the spacer 12, enables various magnetic stacks 20 usable for different types of magnetic devices including logic and memory devices.

FIGS. 2A-2B and FIGS. 3A-3B show exemplary magnetic stacks 20a-20d that can be used for realizing different magnetic devices, according to embodiments. Generally, these magnetic stacks 20a-20d may include the top-pinned magnetic structure 10 as shown in FIG. 1. Further, generally, a magnetic device according to an embodiment may comprise a bottom electrode and a top electrode (not shown for clarity), wherein the magnetic structure 10 or magnetic stack 20 is arranged between the bottom electrode and the top electrode.

Figures 2A, 2B:
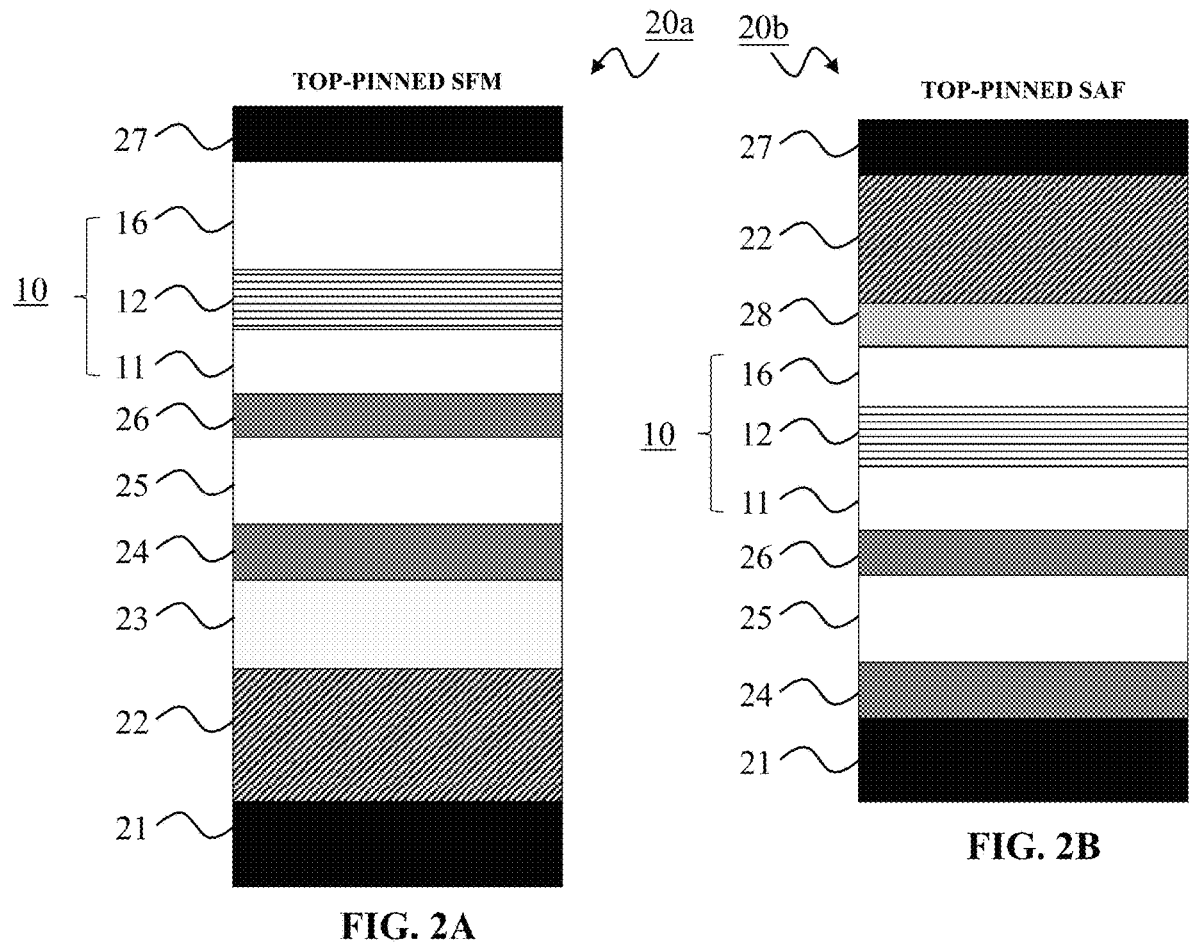
FIGS. 2A and 2B show two exemplary magnetic stacks according to embodiments of the disclosure, including a magnetic structure according to an embodiment of the disclosure.

The magnetic stack 20a shown in FIG. 2A is an example of a top-pinned SFM stack. Generally, a top-pinned SFM stack 20a may be realized based on the magnetic structure 10, which includes the RL 11, the MTLS 12, and the PL or HL 16.

The exemplary stack 20a of FIG. 2A comprises the following layers in the given order: a bottom seed layer 21, a CM 22 (or a HL 22), a decoupling layer 23, a barrier layer 24 (e.g., MgO layer), a FL 25, a tunnel barrier layer 26 (e.g. MgO layer), a RL 11, the MTLS 12, a HL 16, and a top cap layer 27. The RL 11, the MTLS 12 and the HL 16 form a magnetic structure 10.

The magnetic stack 20b shown in FIG. 2B is an example of a top-pinned SAF stack. Generally, a top-pinned SAF stack 20b may be realized based on the magnetic structure 10, which includes the RL 11, the MTLS 12, and the PL or HL 16.

The exemplary stack 20b of FIG. 2B comprises the following layers in the given order: a bottom seed layer 21, a barrier layer 24 (e.g. MgO layer), a FL 25, a tunnel barrier layer 26 (e.g. MgO layer), a RL 11, the MTLS 12, a PL 16, a RKKY spacer layer 28, a CM 22 (or a HL 22), and a top cap layer 27. The RL 11, the MTLS 12 and the PL 16 form a magnetic structure 10.

Figures 3A, 3B:
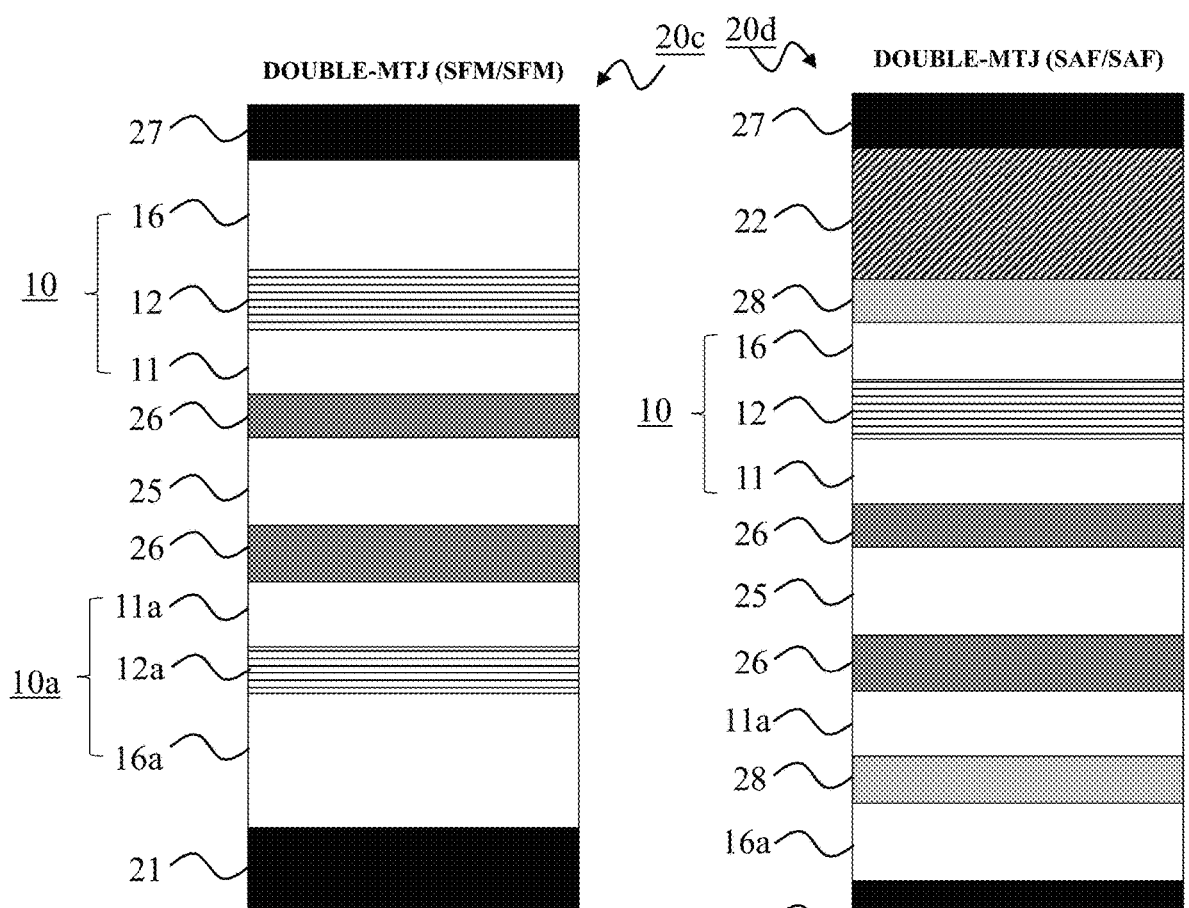
FIGS. 3A and 3B show two exemplary magnetic stacks according to embodiments of the disclosure, including a magnetic structure according to an embodiment of the disclosure.

The magnetic stack 20c shown in FIG. 3A is an example of a double-MTJ SFM stack. Generally, a double-MTJ SFM stack 20c may be realized based on the magnetic structure 10, which includes the RL 11, the MTLS 12, and the PL or HL 16.

The exemplary stack 20c of FIG. 3A comprises the following layers in the given order: a bottom seed layer 21, a first HL 16a, a MTLS 12a (comprising a second texture breaking layer 15a being provided on the HL 16a, a magnetic bridge layer 14a being provided on the second texture breaking layer 15a, and a first texture breaking layer 13a being provided on the magnetic bridge layer 14a) or a conventional spacer, a first RL 11a (provided on the first texture breaking layer 13a or on the conventional spacer), a first tunnel barrier layer 26 (e.g., MgO layer), a FL 25, a second tunnel barrier layer 26 (e.g. MgO layer), a second RL 11, the MTLS 12, a second HL 16, and a top cap layer 27. At least the second RL 11, the MTLS 12 and the second HL 16 form a magnetic structure 10. The first RL 11a, the MTLS 12a and the first HL 16a may form another magnetic structure 10a, according to an embodiment of the disclosure.

The magnetic stack 20d shown in FIG. 3B is an example of a double-MTJ SAF stack. Generally, a double-MTJ SAF stack 20d may be realized based on the magnetic structure 10, which includes the RL 11, the MTLS 12, and the PL or HL 16.

The exemplary stack 20d of FIG. 3B comprises the following layers in the given order: a bottom seed layer 21, a first HL 16a, a first RKKY spacer layer 28, a first RL 11a, a first tunnel barrier layer 26 (e.g., MgO layer), a FL 25, a second tunnel barrier layer 26 (e.g., MgO layer), a second RL 11, the MTLS 12, a PL 16, a second RKKY spacer layer 28, a CM 22 (or a HL 22), and a top cap layer 27. The second RL 11, the MTLS 12 and the second HL 16 form a magnetic structure 10.

A magnetic stack 20 for a double SAF/SFM or SFM/SAF type magnetic device (not shown), comprising the magnetic structure 10, is also possible.

The magnetic structure 10 can accordingly be added to various magnetic device designs. The magnetic structure 10 enables, for instance, thin double-MTJ devices with a RL PF well above 4 kOe, and a thicknesses of below 35 nm, which is approaching that of a conventional bottom-pinned device. For a SAF based device, e.g., for use in an SOT MRAM or STMG device, a 'c-SAF' design, enabling high RL anisotropy, can be envisioned.

Figure 4A:
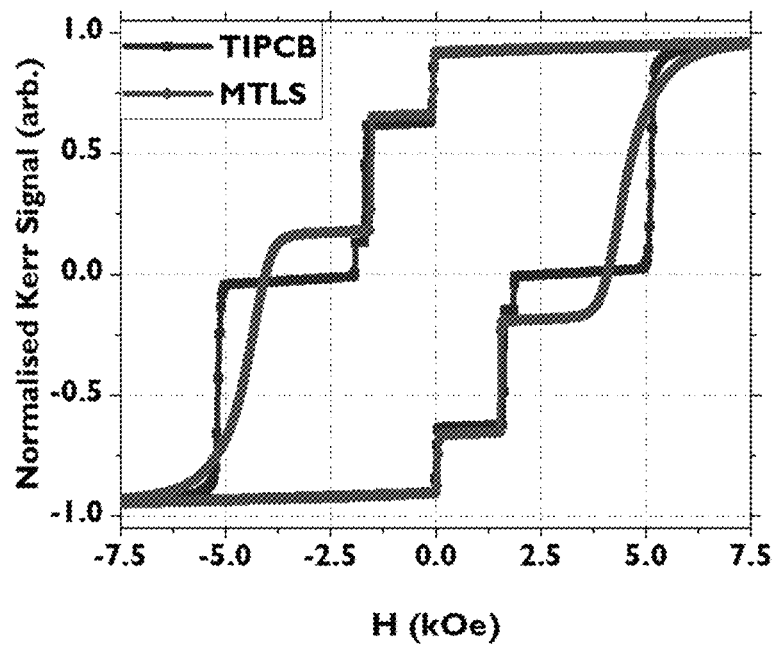
FIG. 4A shows a comparison of performances of the magnetic structure according to an embodiment in a top-pinned standalone magnetic stack (SFM with CM) to a conventional top-pinned SFM stack.
Figure 4B:
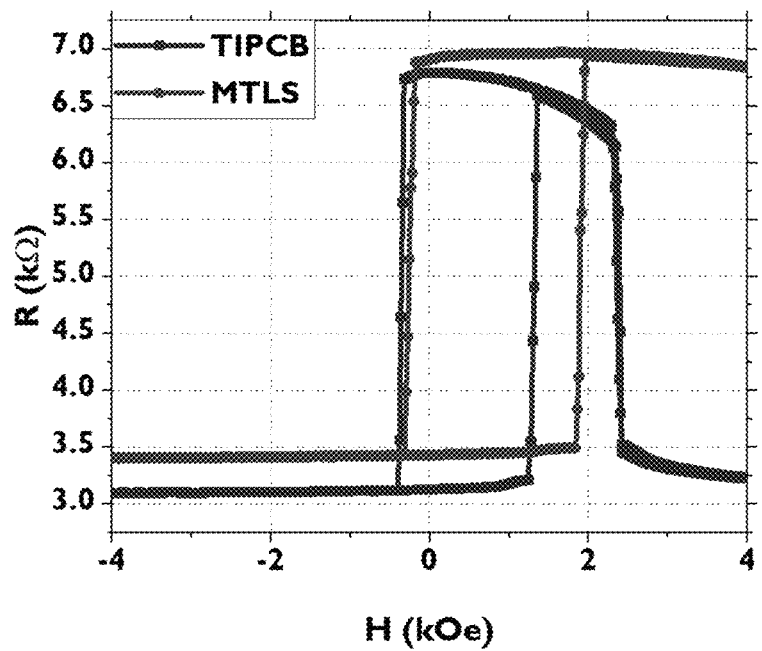
FIG. 4B shows a comparison of performances of the magnetic structure according to an embodiment in a top-pinned standalone magnetic stack (SFM with CM) to a conventional top-pinned SFM stack at a device level.

FIG. 4A compares the MTLS 12 with the TIPCB spacer 77 in terms of PF, in a stand-alone top-pinned stack at blanket. For the MTLS 12, the RL 11 is now seen to fully couple to the HL 16 giving a PF of ~4.5 kOe. This is compared to a PF of only ~2.5 kOe in the same top-pinned stack including the TIPCB spacer 77. This is further evident at device level, as is shown in FIG. 4B, where the RL 11 can be seen reversing in the conventional top-pinned stack, while for the stack using the MTLS 12, no reversing of the RL 11 can be seen.

Figure 5:
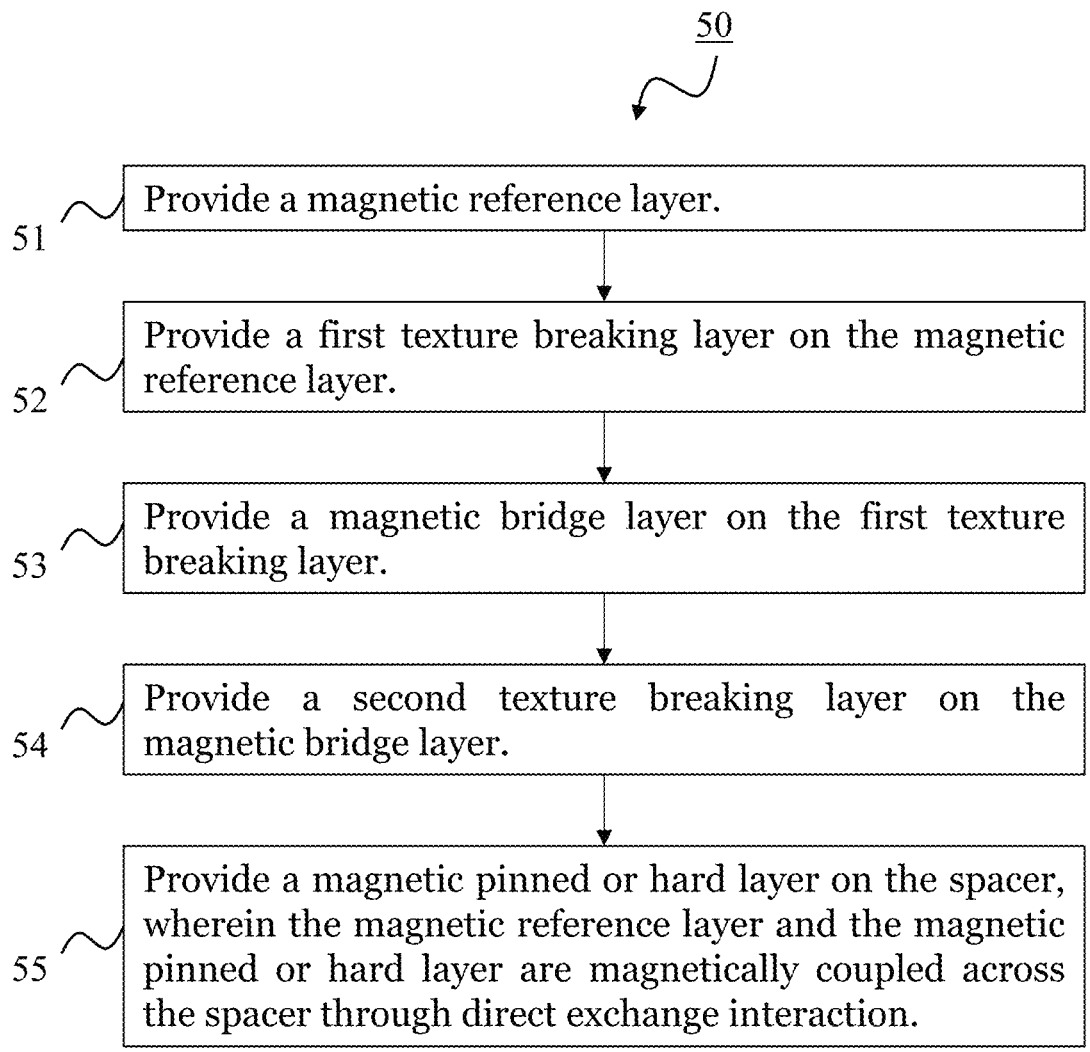
FIG. 5 shows a method according to an embodiment of the disclosure.

FIG. 5 shows a method 50 according to an embodiment. The method 50 is suitable for fabricating a magnetic structure 10 as in FIG. 1, e.g., for fabricating a magnetic stack 20 as in FIG. 2A, 2B, 3A or 3B.

The method 50 comprises a step 51 of providing a magnetic RL 11. Further, the method 50 comprises a step of providing a spacer 12 on the magnetic RL 11, wherein this step comprises a step 52 of providing a first texture breaking layer 13 on the magnetic RL 11, a step 53 of providing a magnetic bridge layer 14 on the first texture breaking layer 13, and a step 54 of providing a second texture breaking 15 layer on the magnetic bridge layer. The method 50 further comprises a step 55 of providing a magnetic PL or HL 16 on the spacer 12, wherein the magnetic RL 11 and the magnetic PL or HL 16 are magnetically coupled across the spacer 12 through direct exchange interaction.

Subsequently, the method 50 may comprise processing the magnetic structure 10 fabricated by the steps 51-55 at temperatures above 350° C. or even above 400° C. Processing the magnetic structure 10 further at such temperatures may, for example, occur in BEOL processing. The magnetic structure 10 is able to withstand such elevated temperatures for an extended period of time.

The embodiments of the disclosure provide several advantages as described throughout this disclosure. In particular, in a typical RKKY spacer-based coupling systems, the RL PF depends on the integrity of the RKKY layers (composition/thickness) and its interfaces. As such it can only degrade with patterning the magnetic structure into a magnetic device, due to strain and/or intermixing. However, according to the embodiments of this disclosure, as the RL 11 is directly coupled to the PL or HL 16, the RL PF may increase after fabrication, since the coupling strength is typically increasing when intermixing happens (magnetic alloy formation). While the oscillatory nature of a conventional RKKY coupling means that it is very sensitive to layer thickness drift, in the embodiments of this disclosure, once the direct coupling is achieved, the thickness dependence is minor.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while features may be presented in a given arrangement, alternative embodiments may perform similar functionalities with different components and/or topologies, and some features may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A magnetic structure for a magnetic device, the magnetic structure comprising:
    a seed layer;
    a magnetic reference layer formed over the seed layer;
    a spacer on the magnetic reference layer, the spacer comprising:
        a first texture breaking layer provided on the magnetic reference layer,
        a magnetic bridge layer provided on the first texture breaking layer, and
        a second texture breaking layer provided on the magnetic bridge layer; and
    a magnetic pinned or hard layer on the spacer,
    wherein the magnetic reference layer and the magnetic pinned or hard layer are magnetically coupled across the spacer through direct exchange interaction, and
    wherein the magnetic device is a top-pinned device having the magnetic pinned or hard layer positioned farther away from the seed layer relative to the magnetic reference layer.

2. The magnetic structure according to claim 1, wherein the second texture breaking layer is a monolayer or sub-monolayer.

3. The magnetic structure according to claim 1, wherein the second texture breaking layer comprises a material suitable for providing Ruderman-Kittel-Kasuya-Yosida (RKKY) interaction, and wherein a thickness of the material is less than a material thickness that corresponds to the first antiferromagnetic peak.

4. The magnetic structure according to claim 1, wherein the second texture breaking layer comprises Ru, Ir or Cr.

5. The magnetic structure according to claim 1, wherein a thickness of the second texture breaking layer is less than 0.4 nm.

6. The magnetic structure according to claim 1, wherein the second texture breaking layer comprises Ta, Mo or W.

7. The magnetic structure according to claim 1, wherein a thickness of the second texture breaking layer is less than 0.6 nm.

8. The magnetic structure according to claim 1, wherein the magnetic bridge layer comprises Co, Ni, Fe or an alloy thereof.

9. The magnetic structure according to claim 8, wherein a thickness of the magnetic bridge layer is between 0.5-1.5 nm.

10. The magnetic structure according to claim 1, wherein the first texture breaking layer comprises Ta, W, Mo or an alloy thereof.

11. The magnetic structure according to claim 10, wherein a thickness of the first texture breaking layer is 0.25-0.5 nm.

12. The magnetic structure according to claim 1, wherein the magnetic hard layer comprises a 111-textured layer.

13. The magnetic structure according to claim 12, wherein the magnetic hard layer comprises an alloy selected from the group consisting of Co(Fe)/Pt, Co(Fe)/Ni, Co(Fe)/Pd, Co(Fe)Pt, Co(Fe)Pd or Co(Fe)Ni.

14. The magnetic structure according to claim 1, further comprising:
    a tunnel barrier layer, on which the magnetic reference layer is formed; and
    a magnetic free layer, on which the tunnel barrier layer is formed.

15. A magnetic device comprising:
    a bottom electrode and a top electrode; and
    a magnetic structure according to claim 1,
    wherein the magnetic structure is arranged between the bottom electrode and the top electrode.

16. The magnetic device according to claim 15, wherein the magnetic device comprises one of:
    a synthetic ferromagnet (SFM) comprising the magnetic structure;
    a synthetic antiferromagnet (SAF) comprising the magnetic structure;
    a double SFM/SFM type magnetic tunnel junction (MTJ) comprising the magnetic structure;
    a double SAF/SAF type MTJ comprising the magnetic structure; and
    a double SAF/SFM or SFM/SAF type MTJ comprising the magnetic structure.

17. A method of fabricating a magnetic structure for a magnetic device, the method comprising:
  providing a seed layer;
  providing a magnetic reference layer over the seed layer;
  providing a spacer on the magnetic reference layer, the spacer comprising:
    a first texture breaking layer on the magnetic reference layer,
    a magnetic bridge layer on the first texture breaking layer, and
    a second texture breaking layer on the magnetic bridge layer; and
  providing a magnetic pinned or hard layer on the spacer,
  wherein the magnetic reference layer and the magnetic pinned or hard layer are magnetically coupled across the spacer through direct exchange interaction, and
  wherein the magnetic device is a top-pinned device having the magnetic pinned or hard layer positioned farther away from the seed layer relative to the magnetic reference layer.

18. The method according to claim 17, further comprising processing the magnetic structure, after providing the magnetic reference layer, the spacer and the magnetic pinned or hard layer, at 350° C. or above.

19. The magnetic structure according to claim 1, further comprising a cap layer provided on the magnetic pinned or hard layer.

20. The magnetic structure according to claim 19, wherein the magnetic pinned or hard layer comprises a first magnetic hard layer, wherein the magnetic structure further comprises a second magnetic hard layer provided on the seed layer.

* * * * *